(12) United States Patent
Hiruma et al.

(10) Patent No.: US 9,966,245 B2
(45) Date of Patent: May 8, 2018

(54) COOLING APPARATUS, ILLUMINATION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventors: Kentaro Hiruma, Saitama (JP); Manato Furusawa, Utsunomiya (JP); Noboru Osaka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 14/960,583

(22) Filed: Dec. 7, 2015

(65) Prior Publication Data

US 2016/0163531 A1    Jun. 9, 2016

(30) Foreign Application Priority Data

Dec. 9, 2014 (JP) ................. 2014-249196

(51) Int. Cl.
| | | |
|---|---|---|
| *G03F 7/20* | (2006.01) | |
| *H01J 61/52* | (2006.01) | |
| *G03F 7/32* | (2006.01) | |
| *H01J 61/86* | (2006.01) | |

(52) U.S. Cl.
CPC ............. *H01J 61/526* (2013.01); *G03F 7/20* (2013.01); *G03F 7/32* (2013.01); *G03F 7/70016* (2013.01); *G03F 7/70891* (2013.01); *H01J 61/86* (2013.01)

(58) Field of Classification Search
CPC .................................................. G03F 7/7005
See application file for complete search history.

(56) References Cited

U.S. PATENT DOCUMENTS

| | | | | | |
|---|---|---|---|---|---|
| 3,311,769 | A | * | 3/1967 | Schmidtlein | H01J 61/523 313/32 |
| 3,412,275 | A | * | 11/1968 | Thouret | H01J 61/526 313/30 |
| 5,305,054 | A | * | 4/1994 | Suzuki | G03F 7/7005 355/53 |
| 5,399,931 | A | * | 3/1995 | Roberts | H01J 61/52 313/110 |

(Continued)

FOREIGN PATENT DOCUMENTS

| | | |
|---|---|---|
| CN | 1341233 A | 3/2002 |
| CN | 1613136 A | 5/2005 |

(Continued)

OTHER PUBLICATIONS

Anaconda Vibration Eliminators price list, http://www.hvacpartsource.com/Anaconda_Vibration_Eliminators_s/2256.htm, accessed Sep. 12, 2017.*

(Continued)

*Primary Examiner* — Steven H Whitesell Gordon
(74) *Attorney, Agent, or Firm* — Rossi, Kimms & McDowell LLP

(57) ABSTRACT

A cooling apparatus for cooling a light source unit is provided. The cooling apparatus includes a cooling unit provided outside a path of light from the light source unit, and a heat pipe configured to connect a heat generating portion of the light source unit and the cooling unit. The heat pipe also serves as an electrode wire of the light source unit.

9 Claims, 9 Drawing Sheets

(56) References Cited

U.S. PATENT DOCUMENTS

| | | |
|---|---|---|
| 6,771,353 B2 | 8/2004 | Sato |
| 6,784,601 B2 | 8/2004 | Kai et al. |
| 7,857,496 B2 * | 12/2010 | Hofmann .............. F21S 48/328 |
| | | 362/296.1 |
| 8,334,654 B2 | 12/2012 | Kikuchi et al. |
| 8,531,093 B2 | 9/2013 | Shirasu et al. |
| 2002/0158579 A1 * | 10/2002 | Kai ...................... F21V 29/004 |
| | | 313/635 |
| 2008/0218078 A1 | 9/2008 | Monch et al. |
| 2010/0027265 A1 | 2/2010 | Nauen et al. |
| 2010/0118287 A1 * | 5/2010 | Kikuchi ................... H01J 5/54 |
| | | 355/69 |

FOREIGN PATENT DOCUMENTS

| | | | |
|---|---|---|---|
| CN | 101548132 A | 9/2009 | |
| JP | H11283898 A | 10/1999 | |
| JP | 2008262911 A | 10/2008 | |
| TW | 200907240 A | 2/2009 | |
| TW | 201324584 A | 6/2013 | |

OTHER PUBLICATIONS

Office Action issued in Taiwanese Appln. No. 104137334, dated Oct. 26, 2016. English translation provided.

Office Action issued in Chinese Appln. No. 201510882884.2 dated Apr. 6, 2017. English translation provided.

* cited by examiner

F I G. 2
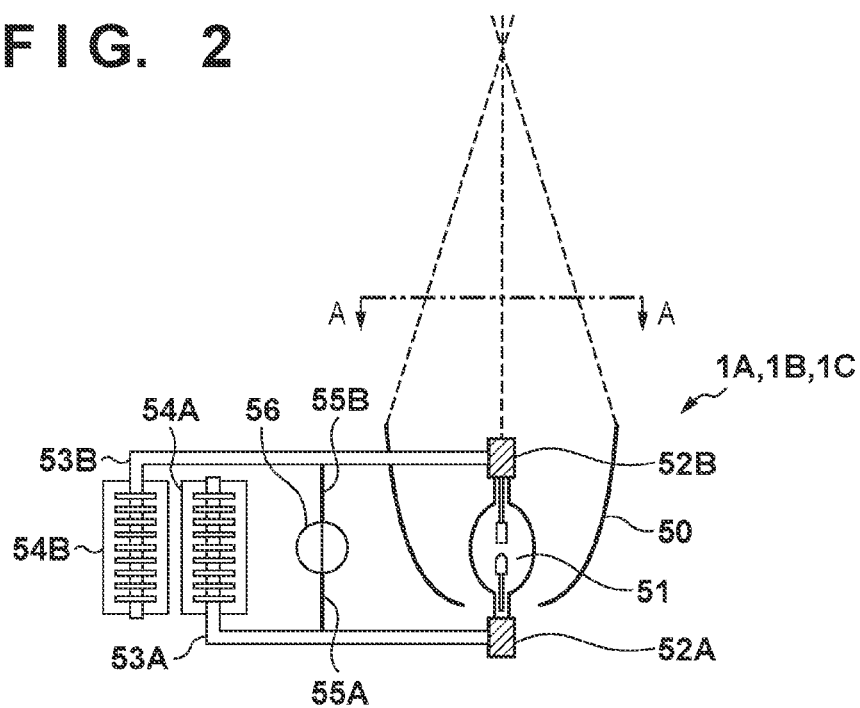
F I G. 3A
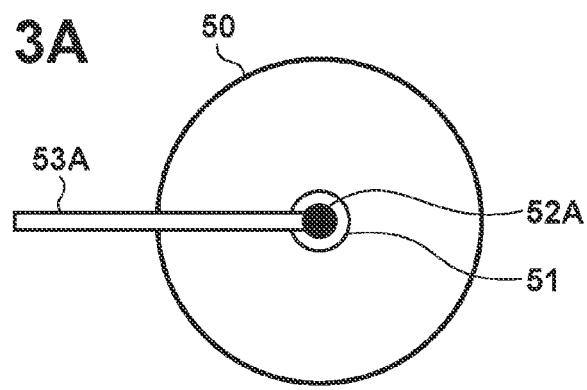
F I G. 3B
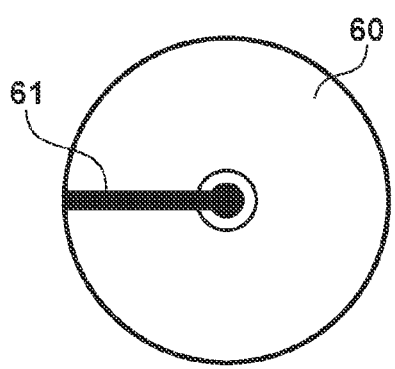

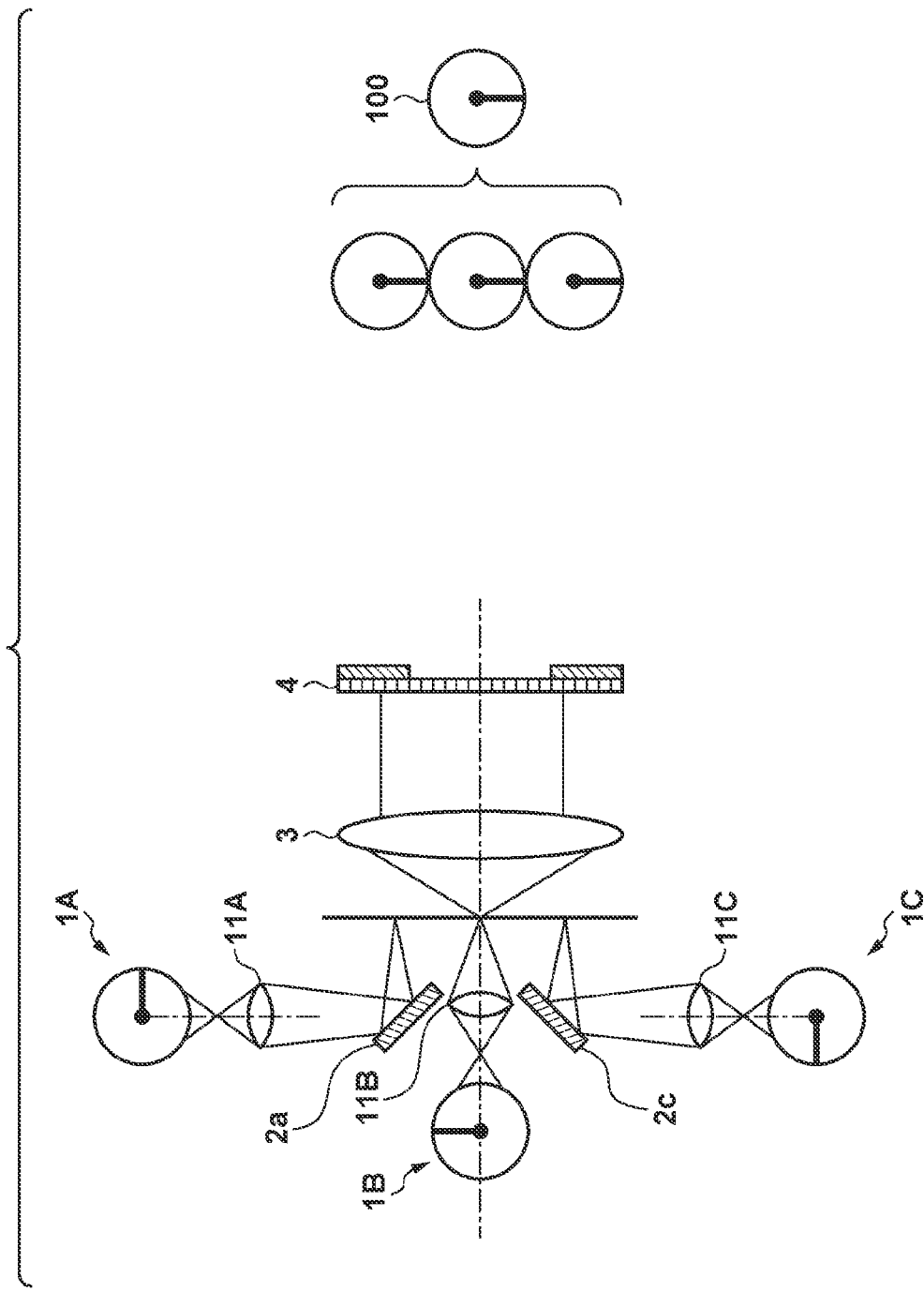

F I G. 11A
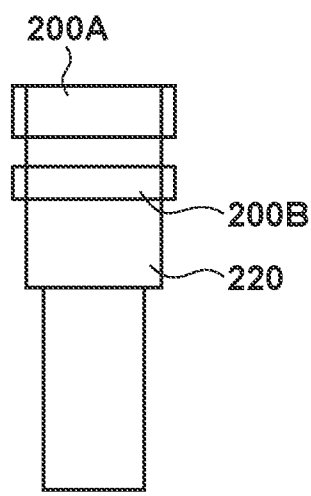
F I G. 11B
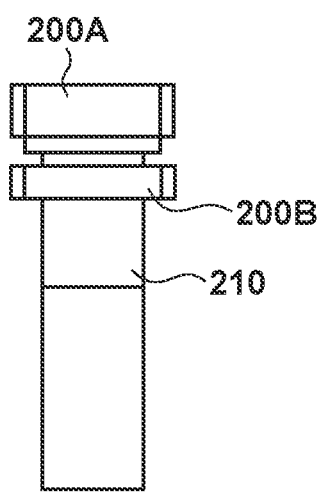

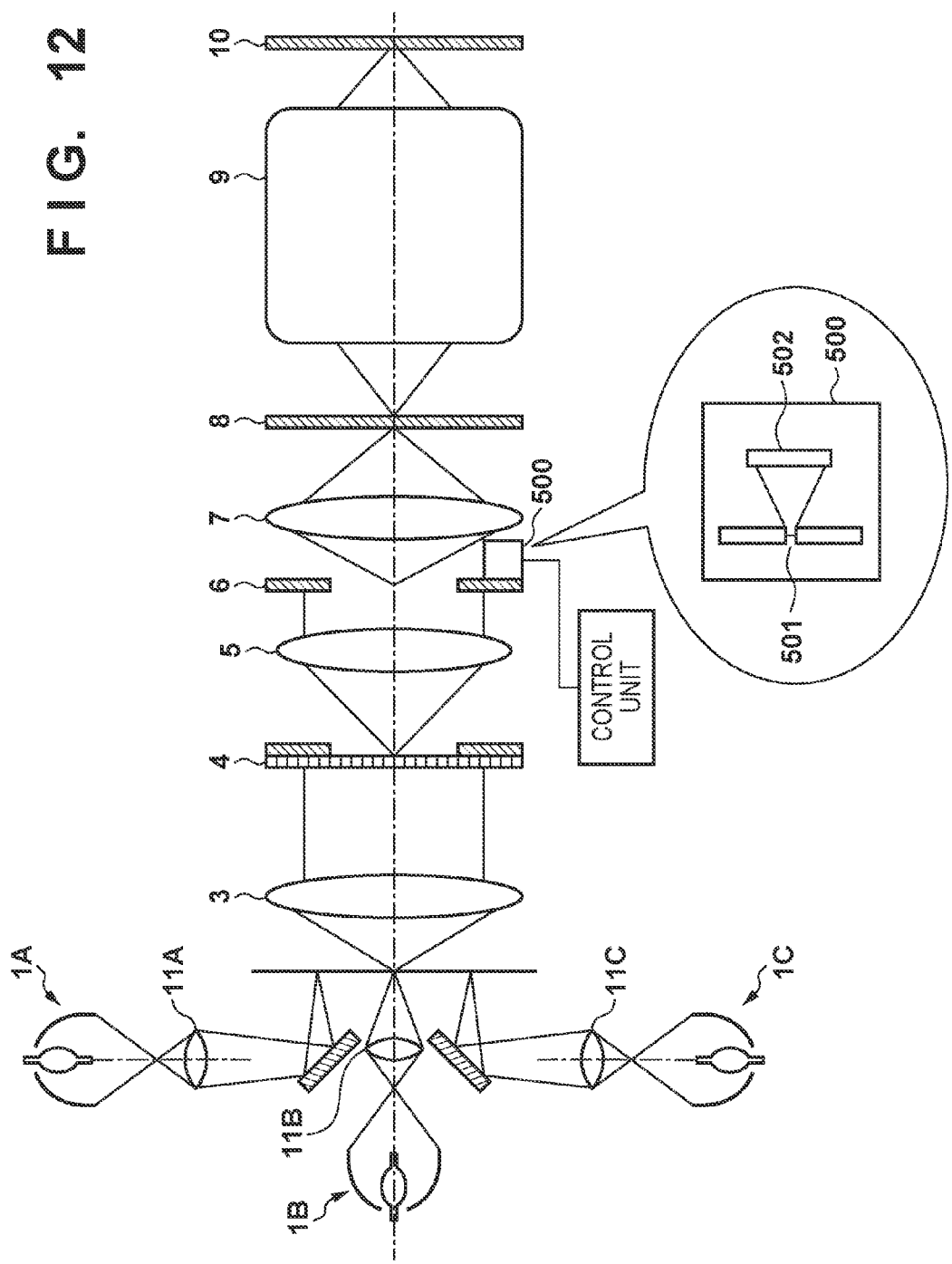

COOLING APPARATUS, ILLUMINATION OPTICAL SYSTEM, EXPOSURE APPARATUS, AND METHOD OF MANUFACTURING ARTICLE

BACKGROUND OF THE INVENTION

Field of the Invention

The present invention relates to a cooling technique for a light source used in lithography or the like.

Description of the Related Art

An exposure apparatus is an apparatus that transfers the pattern of an original (reticle or mask) onto a photosensitive substrate (for example, a wafer or glass plate with a resist layer formed on the surface) via a projection optical system in a lithography process that is a manufacturing process of a semiconductor device, a liquid-crystal display device, or the like. For example, a projection exposure apparatus that transfers a pattern onto a liquid-crystal display device is recently required to expose a larger area pattern on a mask onto a substrate at once. To meet this requirement, a step-and-scan type scanning projection exposure apparatus capable of attaining a high resolving power and exposing a larger screen has been proposed. The scanning exposure apparatus exposes and transfers a pattern illuminated with a slit light beam onto a substrate by a scanning operation via a projection optical system.

In such a scanning exposure apparatus, a high output light source such as a discharge lamp is used to improve productivity. An illumination optical system with the light source includes not only an electrode wire but also a cooling unit aiming at cooling a bayonet cap portion (heat generating portion). The electrode wire and the cooling unit are arranged close to the light source unit for conduction and heat transfer, and therefore cast a shadow on exposure light and adversely affect the effective light source. An effective light source distribution is a light intensity distribution on the pupil plane of an illumination optical system that illuminates a mask. Hence, to minimize the adverse effect on the effective light source distribution, the electrode wire and the cooling unit need to be made small. Japanese Patent Laid-Open No. 2008-262911 discloses an arrangement in which a refrigerant flow channel is provided in the bayonet cap portion (heat generating portion) of a discharge lamp, thereby integrating a cooling unit and the light source unit.

In the technique of Japanese Patent Laid-Open No. 2008-262911, however, it is believed that the mechanism for providing the refrigerant flow channel in the electrode portion of the discharge lamp makes the electrode portion large and therefore cannot simply lead to minimization of the influence on the effective light source distribution. Additionally, the electrode portion of the discharge lamp becomes complex, resulting in a high cost of the discharge lamp.

SUMMARY OF THE INVENTION

The present invention provides, for example, a technique advantageous in a light source cooling efficiency and suppression of an adverse effect on an effective light source distribution.

According to one aspect of the present invention, a cooling apparatus for cooling a light source unit is provided. The apparatus comprises a cooling unit provided outside a path of light from the light source unit, and a heat pipe configured to connect a heat generating portion of the light source unit and the cooling unit, wherein the heat pipe also serves as an electrode wire of the light source unit.

Further features of the present invention will become apparent from the following description of exemplary embodiments (with reference to the attached drawings).

BRIEF DESCRIPTION OF THE DRAWINGS

FIG. 2 is a view showing the arrangement of a light source unit and a cooling apparatus according to the embodiment;

FIGS. 3A and 3B are views for explaining a state in which light from a discharge lamp is blocked by a heat pipe;

FIG. 4 is a view for explaining the combined shape of light beams from three light source units;

FIGS. 11A and 11B are views for explaining an example in which the heat pipe connecting portion has a two-piece structure; and FIG. 12 is a view showing another example of the arrangement of an illumination optical system included in a scanning exposure apparatus.

DESCRIPTION OF THE EMBODIMENTS

Various exemplary embodiments, features, and aspects of the invention will be described in detail below with reference to the drawings.

Embodiments of the present invention will now be described in detail with reference to the accompanying drawings. It should be noted that the present invention is not limited to the following embodiments, and the embodiments are merely detailed examples advantageous in implementing the present invention. In addition, not all the combinations of features described in the following embodiments are necessarily essential to the solving means of the present invention.

First Embodiment

Figure 1:
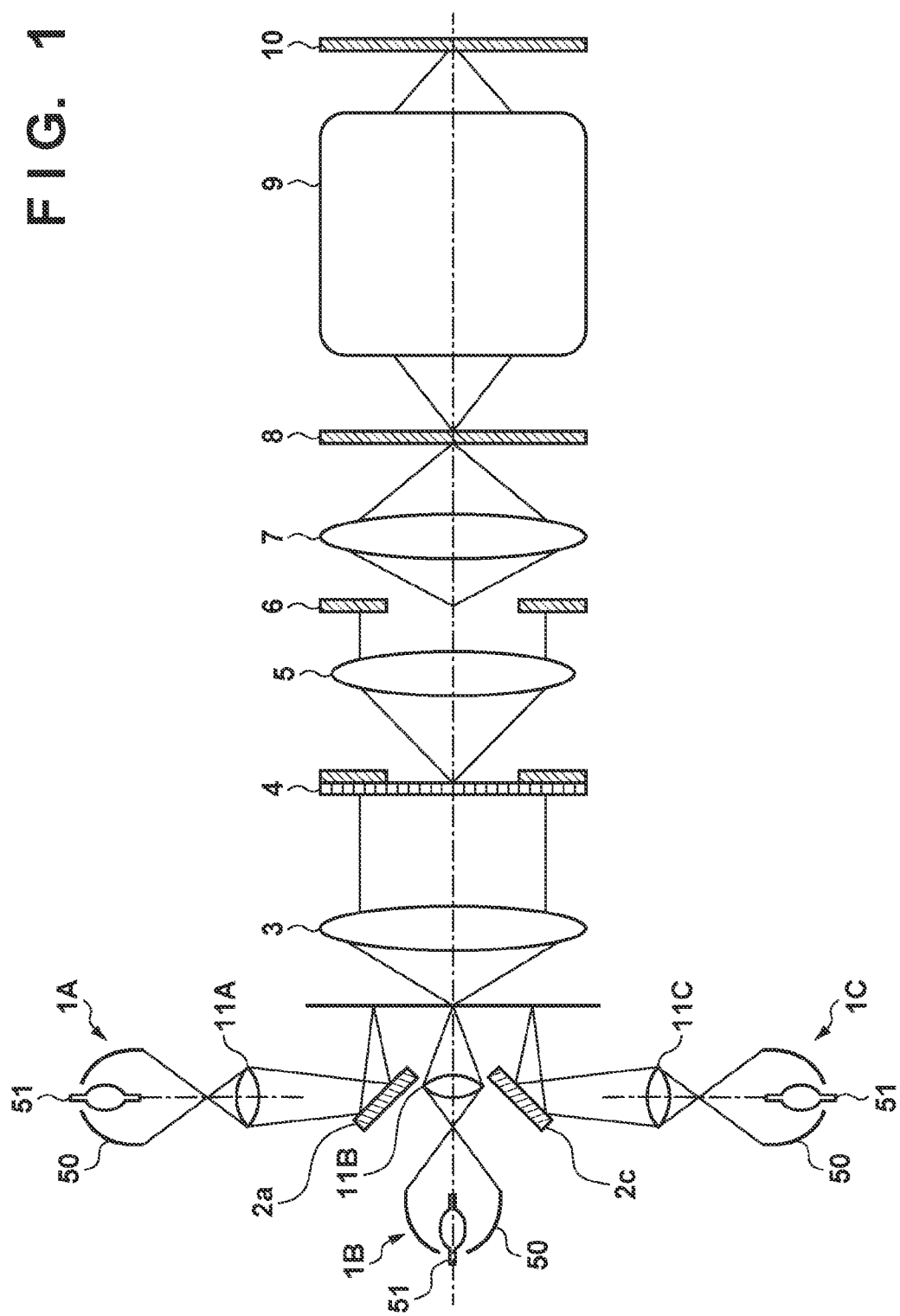
FIG. 1 is a view showing the arrangement of an illumination optical system according to the embodiment.

FIG. 1 shows an example of the arrangement of an illumination optical system to which a cooling apparatus according to the present invention is applied. The illumination optical system is a device that can be included in, for example, an exposure apparatus such as a scanning exposure apparatus and is configured to guide light from a light source unit to an original (mask) that is an irradiation target on which a pattern is formed.

The illumination optical system includes a plurality of light source units. For example, the illumination optical system includes three light source units 1A, 1B, and 1C. Each of the light source units 1A, 1B, and 1C includes a discharge lamp 51 and an ellipsoid mirror 50. However, the present invention is also applicable to an arrangement using a light source other than a discharge lamp. The light-emitting point of the discharge lamp 51 is placed at the first focal point of the ellipsoid mirror 50.

Light beams emitted by the light source units 1A, 1B, and 1C are focused at the second focal points of the ellipsoid mirrors and then pass through Fourier transform optical systems 11A, 11B, and 11C, respectively. The light beams that have passed through the Fourier transform optical systems 11A and 11C are respectively bent by two polarizing mirrors 2a and 2c that are perpendicular to each other. The bent light beams are combined with the light beam that has passed through the Fourier transform optical system 11B. The combined light beam passes through a Fourier transform optical system 3 and enters a fly-eye lens group 4. The Fourier transform optical system 3 is arranged such that the second focal positions of the ellipsoid mirrors 50 arranged in the light source units LA, 1B, and 1C and the incident surface of the fly-eye lens group 4 form Fourier conjugate planes. After that, the light beam exited from the exit surface of the fly-eye lens group 4 passes through a Fourier transform optical system 5 and enters a slit surface 6. An imaging optical system 7 and a projection optical system 9 are arranged such that the slit surface 6, a mask surface 8, and a plate surface 10 form optically conjugate planes. At this time, the light intensity distribution on the exit surface (the pupil plane of an illumination optical system) of the fly-eye lens group 4 represents the effective light source distribution of the projection exposure apparatus (illumination optical system).

As described above, the first focal point of the ellipsoid mirror 50 is arranged so as to match the light-emitting point of the discharge lamp 51. When an extra high voltage is applied to the discharge lamp 51, the discharge lamp 51 emits light. The ambient temperature is increased by the light emission heat of the discharge lamp 51. If the neighboring temperature exceeds, for example, 600° C. due to heat generation of the discharge lamp 51, the bulb of the discharge lamp 51 may burst, and the function as a light source unit may be lost.

To prevent this, in this embodiment, a plurality of cooling apparatuses corresponding to the light source units 1A, 1B, and 1C, respectively, are provided. FIG. 2 shows the arrangement of a light source unit and a cooling apparatus. A cathode unit 52A of the light source unit is connected to a cathode-side cooling unit 54A via a cathode-side heat pipe 53A, and an anode unit 52B of the light source unit is connected to an anode-side cooling unit 54B via an anode-side heat pipe 53B. As described above, in this embodiment, a plurality of sets of light source units, cooling units, and heat pipes are used. The cathode-side cooling unit 54A and the anode-side cooling unit 54B are arranged outside the path of light from the discharge lamp 51. Note that as the heat pipe, for example, a thermal conduction pipe that is made of copper, aluminum, or the like with a relatively high thermal conduction efficiency and includes a working fluid sealed inside can be used. In addition, as the cooling unit, for example, a heat sink with a radiation fin made of copper, aluminum, or the like can be used. Hence, the heat pipe functions as a heat transfer element that moves heat from the heat generating portion of the light source unit to the cooling unit. Heat generated by the discharge lamp 51 moves from the cathode unit 52A to the cathode-side heat pipe 53A and the cathode-side cooling unit 54A in this order and air- or liquid-cools the cathode-side cooling unit 54A. The heat is thus exhausted from the light source unit to the outside. Similarly, heat generated by the discharge lamp 51 moves from the anode unit 52B to the anode-side heat pipe 53B and the anode-side cooling unit 54B in this order and air- or liquid-cools the anode-side cooling unit 54B. The heat is also thus exhausted from the light source unit to the outside. This can maintain the discharge lamp 51 at a desired temperature.

To turn on the discharge lamp 51, a path for supplying power is necessary. To ensure this path, in this embodiment, the cathode-side heat pipe 53A and the anode-side heat pipe 53B also serve as electrode wires. Each of the cathode-side heat pipe 53A and the anode-side heat pipe 53B is generally formed from a copper member and can therefore supply power as an electrode wire. Hence, a discharge lamp power supply 56 and the cathode-side heat pipe 53A are connected via a cathode-side power supply cable 55A, and the discharge lamp power supply 56 and the anode-side heat pipe 53B are connected via an anode-side power supply cable 55B. This makes it possible to supply power from the discharge lamp power supply 56 to the discharge lamp 51 via the heat pipes.

FIG. 3A is a view taken along a line A-A in FIG. 2. Light beams emitted by the discharge lamps 51 pass the ellipsoid mirrors 50 and then move to the Fourier transform optical systems 11A, 11B, and 11C. Some light components are blocked by the anode-side heat pipe 53B halfway. That is, the anode-side heat pipe 53B can be observed as a shadow on the effective light source distribution. FIG. 3B is a view schematically illustrating showing this state. As described above, in this embodiment, since the cathode-side heat pipe 53A and the anode-side heat pipe 53B also serve as electrode wires, no electrode wires need be separately arranged. It is therefore possible to reduce the adverse effect of separately arranged electrode wires on the effective light source distribution.

The effective light source distribution obtained by combining the three light source units will be described next. For the descriptive convenience, assume that the energy of a plan view region 60 of the ellipsoid mirror 50 is 100%, and the energy of a shadow portion 61 of the anode-side heat pipe 53B is 0%. Since the illumination optical system according to this embodiment includes three light source units, the shadow of the anode-side heat pipe 53B is projected in each light source unit. For example, consider an effective light source distribution in which the shadows of the light source units 1A, 1B, and 1C are observed on the slit surface 6, as shown in FIG. 4. When inversion and rotation by lenses and mirrors from the light source units 1A, 1B, and 1C to the slit surface 6 are taken into consideration, combined light of light beams from the three light source units has a shape represented by reference numeral 100.

Figure 5A:
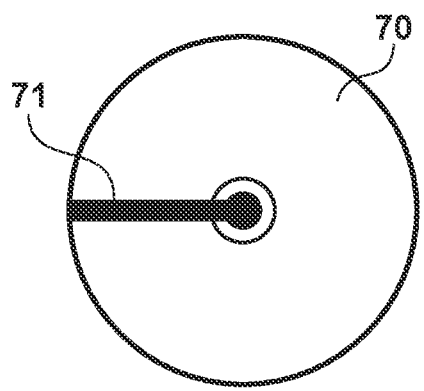
FIGS. 5A and 5B are views for explaining an example of an energy distribution obtained by combining the energy distributions of the three light source units.

FIG. 5A shows an example of an energy distribution obtained by combining the energy distributions of the three light source units, which have been described with reference to FIGS. 3A and 3B. Referring to FIG. 5A, the energy of a region 70 is 300%, and the energy of a shadow portion 71 is 0%. Hence, intensity unevenness occurs in the effective light source distribution, and satisfactory imaging performance cannot be obtained.

Figure 5B:
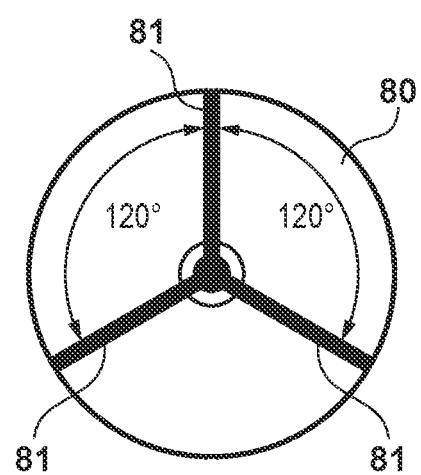
Figure 6:
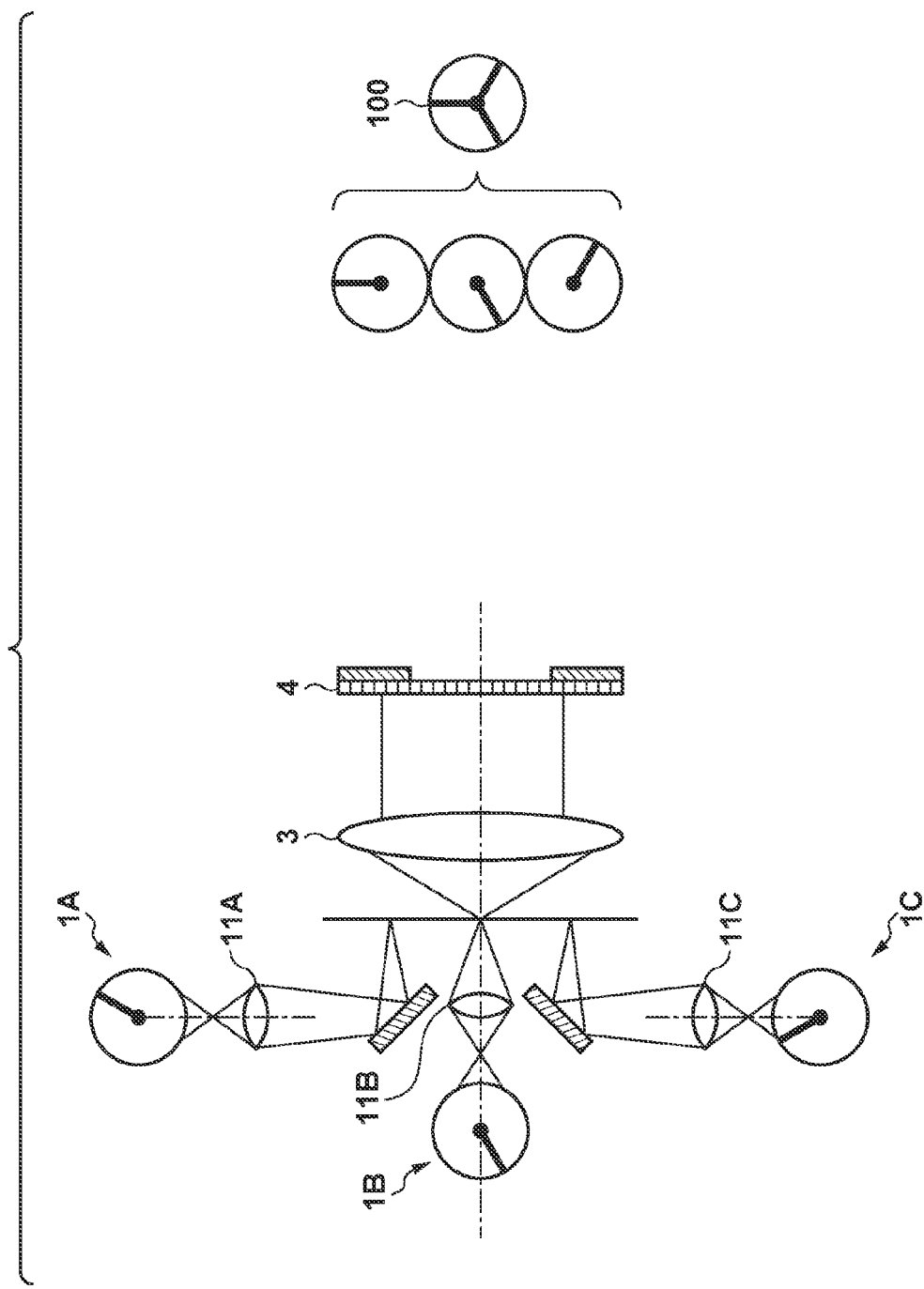
FIG. 6 is a view for explaining an example of the arrangement an anode-side heat pipe.

When an effective light source distribution is formed by combining a plurality of light source units, the shadows of heat pipes are preferably uniformly distributed on the slit surface in the effective light source distribution. Hence, when the shadows are uniformly arranged, as shown in FIG. 5B, the energy of a region 80 is 300%, and the energy of a shadow portion 81 is 200%. The unevenness can thus be reduced. To obtain the effective light source distribution as shown in FIG. 5B, for example, the anode-side heat pipes 53B of the light source units 1A, 1B, and 1C are arranged at almost uniform angles, as shown in FIG. 6, in consideration of inversion by optical systems from the light source units 1A, 1B, and 1C to the slit surface 6.

Figure 7:
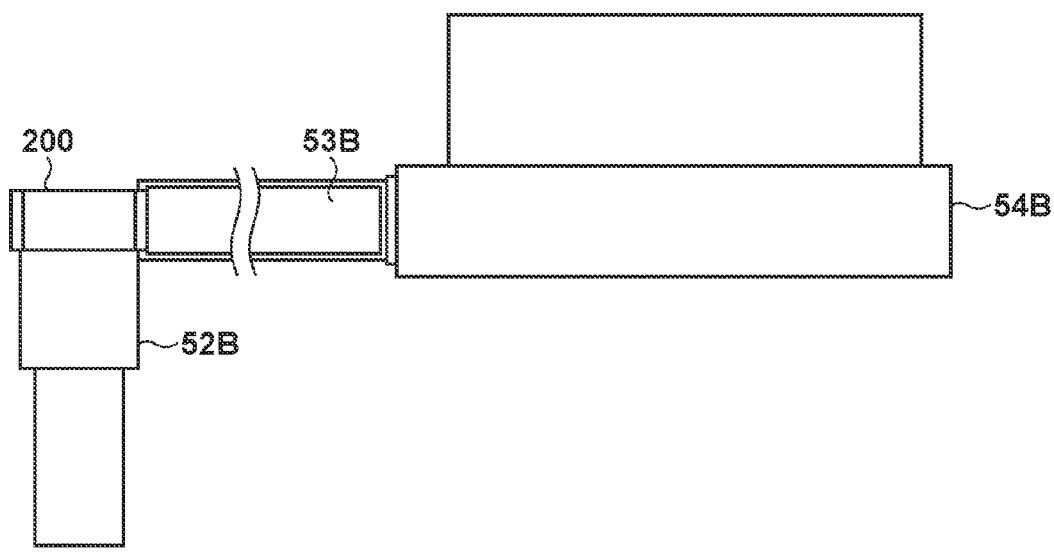
FIG. 7 is a view for explaining an example of the connection between an anode unit and the anode-side heat pipe.

In this embodiment, the anode unit 52B is connected to one end of the anode-side heat pipe 53B via, for example, a heat pipe connecting portion 200, as shown in FIG. 7. The anode-side cooling unit 54B is connected to the other end of the anode-side heat pipe 53B. The anode-side heat pipe 53B and the heat pipe connecting portion 200 are structures that support the free end side of the discharge lamp 51 and are in tight contact with each other to attain efficient heat conduction. The anode-side heat pipe 53B and the heat pipe connecting portion 200 are connected so as to ensure an electric conductivity and obtain a desired resistance or less. Heat generated by the discharge lamp 51 moves from the anode unit 52B to the heat pipe connecting portion 200, the anode-side heat pipe 53B, and the anode-side cooling unit 54B in this order and air- or liquid-cools the anode-side cooling unit 54B. The heat is thus exhausted from the light source unit to the outside. This can maintain the discharge lamp 51 at a desired temperature.

Figure 8:
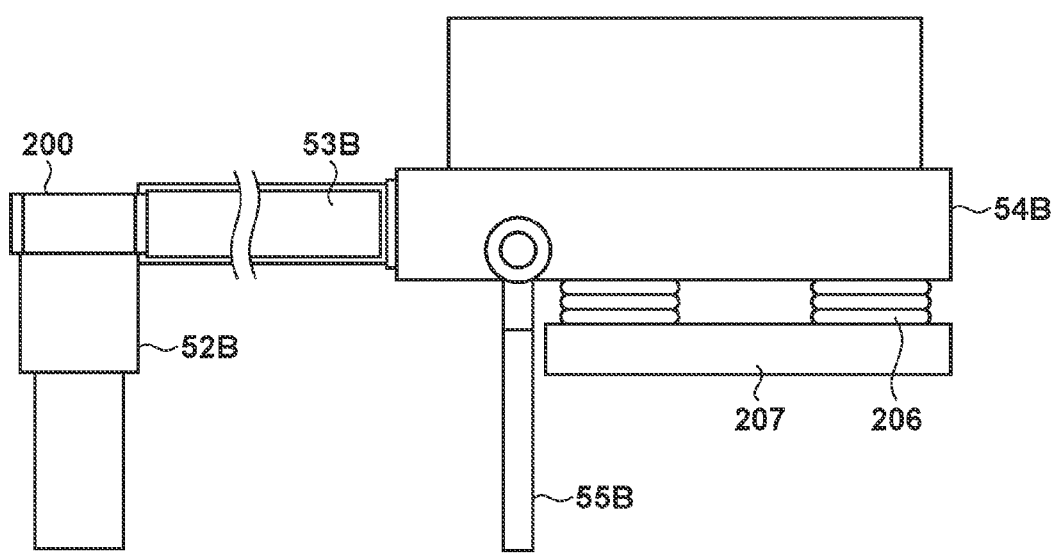
FIG. 8 is a view for explaining an example in which a power supply cable is connected to a cooling unit.

In the example of FIG. 2, the power supply cable is connected to the heat pipe between the discharge lamp power supply 56 and the cooling unit. However, the power supply cable may be connected to the heat pipe in the cooling unit. For example, as shown in FIG. 8, the anode-side power supply cable 55B is connected to the anode-side heat pipe 53B in the anode-side cooling unit 54B. In addition, an insulator 206 is coupled with the anode-side cooling unit 54B. Since the anode-side cooling unit 54B and the anode-side heat pipe 53B have a high potential as compared to another component 207, the insulator 206 that is an insulating member prevents a short circuit.

Figure 9:
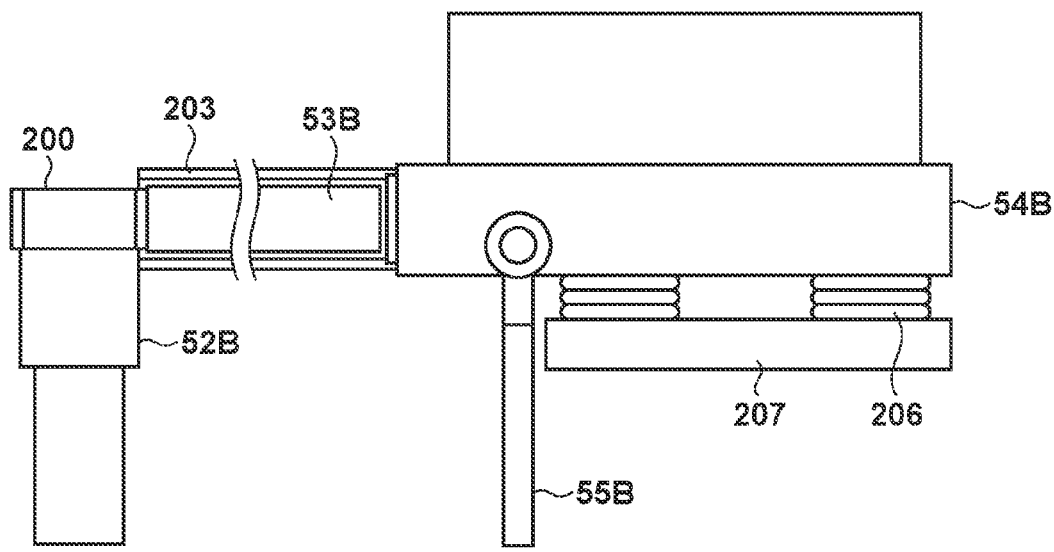
FIG. 9 is a view for explaining an example in which a bare stranded wire is wound around the heat pipe.

The discharge lamp supplies a current of several tens of amperes. Hence, when a current flows to the anode-side heat pipe 53B, the resistance is high, resulting in a power supply failure or heat generation. As a measure against this, a structure may be used in which an electric wire without a cover, that is, a bare stranded wire 203 is wound around the anode-side heat pipe 53B, as shown in FIG. 9, thereby reducing the resistance of the anode-side heat pipe 53B.

Figure 10:
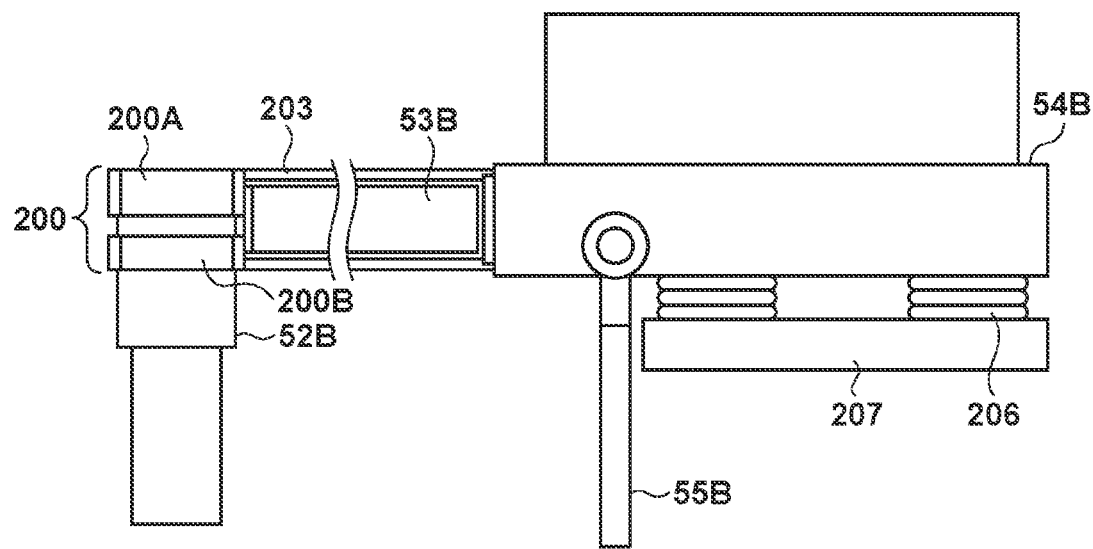
FIG. 10 is a view for explaining an example in which the heat pipe connecting portion has a two-piece structure.

Considering a case in which a plurality of types of discharge lamps such as a standard discharge lamp and a high intensity discharge lamp with a larger heat generation amount are selectively used, the heat pipe connecting portion 200 may be divided into a plurality of parts. For example, as shown in FIG. 10, the heat pipe connecting portion 200 is formed as a two-piece structure including an upper heat pipe connecting portion 200A and a lower heat pipe connecting portion 200B. As shown in FIG. 11A, an anode bayonet cap portion 220 of the high intensity discharge lamp is in tight contact with both the upper heat pipe connecting portion 200A and the lower heat pipe connecting portion 200B. On the other hand, an anode bayonet cap portion 210 of the standard discharge lamp has a stepped shape so that it is in tight contact with only the upper heat pipe connecting portion 200A but not the lower heat pipe connecting portion 200B, as shown in FIG. 11B. This can implement a structure that changes the contact area between the bayonet cap portion and the heat pipe connecting portion in accordance with the shape of the bayonet cap portion of the discharge lamp. When the contact area between the bayonet cap portion and the heat pipe connecting portion becomes small, the thermal conduction efficiency accordingly lowers. By switching the thermal conduction efficiency between the high intensity discharge lamp and the standard discharge lamp, cooling to a desired temperature is possible.

As described above, the illumination optical system according to the present invention can be implemented as a device that is included in, for example, a scanning exposure apparatus and is configured to guide light from a light source unit to an original (mask) that is an irradiation target on which a pattern is formed. FIG. 12 shows another example of the arrangement of the illumination optical system included in a scanning exposure apparatus. The same reference numerals as in FIG. 1 denote the same constituent elements, and a description thereof will be omitted.

Referring to FIG. 12, an effective light source measurement device 500 configured to measure the effective light source distribution formed by the illumination optical system is provided near the slit surface 6. The effective light source measurement device 500 includes a pinhole 501 and a photodetection sensor 502. The effective light source measurement device 500 is configured to, for example, measure the incident angle characteristic of light near the slit surface 6, and may have another arrangement. The effective light source measurement device 500 is preferably drivable near the slit surface 6. In this embodiment, the effective light source measurement device 500 is provided near the slit surface 6. As another example, the effective light source measurement device 500 may be provided in a place (for example, the mask surface 8 or plate surface 10) optically conjugate to the slit surface 6.

An effective light source shape is obtained by a measurement result obtained from the effective light source measurement device 500. A control unit C adjusts at least one of the position and angle of the each light source unit as a whole based on the measurement result such that the positions of shadows generated by the light source units are uniformly distributed. At this time, at least one of the position and angle of not the light source unit as a whole but the heat pipe in each light source unit may be adjusted.

Embodiment of Method of Manufacturing Article

A method of manufacturing an article according to an embodiment of the present invention is suitable to manufacture an article, for example, a microdevice such as a semiconductor device or an element having a microstructure. The article manufacturing method according to this embodiment includes a step of forming a latent image pattern on a photoresist applied to a substrate using the above-described exposure apparatus, and a step of developing the substrate with the latent image pattern formed in the step. The manufacturing method further includes other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-249196, filed Dec. 9, 2014, which is hereby incorporated by reference herein in its entirety.

What is claimed is:

1. A cooling apparatus for cooling a light source unit, comprising:
    a cooling unit having a heat sink provided outside a path of light from the light source unit; and
    a heat pipe including a thermal conduction pipe having a first distal end, a second distal end, and a fluid sealed inside the thermal conduction pipe between the first distal end and the second distal end,
    wherein the heat pipe connects a heat generating portion of the light source unit disposed at the first distal end of the thermal conduction pipe and the heat sink disposed at the second distal end of the thermal conduction pipe, and moves heat generated at the heat generating portion to the heat sink by the fluid sealed inside the thermal conduction pipe between the first distal end and the second distal end, and
    the thermal conduction pipe also serves as an electrode wire of the light source unit.

2. The apparatus according to claim 1, wherein the heat pipe has a structure that reduces a resistance by winding a bare stranded wire.

3. The apparatus according to claim 1, wherein the light source unit comprises a discharge lamp,
    the apparatus further comprises a connecting portion configured to connect a bayonet cap portion of the discharge lamp and the heat pipe, and
    the connecting portion has a structure that changes a contact area between the bayonet cap portion and the connecting portion in accordance with a shape of the bayonet cap portion of the discharge lamp.

4. An illumination optical system comprising:
    a plurality of light source units; and
    a plurality of cooling apparatuses corresponding to the plurality of light source units, respectively,
    wherein each of the plurality of cooling apparatuses comprises:
    a cooling unit having a heat sink provided outside a path of light from a corresponding light source unit out of the plurality of light source units; and
    a heat pipe including a thermal conduction pipe having a first distal end, a second distal end, and a fluid sealed inside the thermal conduction pipe between the first distal end and the second distal end,
    wherein the heat pipe connects a heat generating portion of the corresponding light source unit disposed at the first distal end of the thermal conduction pipe and the heat sink disposed at the second distal end of the thermal conduction pipe, and moves heat generated at the heat generating portion of the corresponding light source unit to the heat sink by the fluid sealed inside the thermal conduction pipe between the first distal end and the second distal end, and
    the thermal conduction pipe also serves as an electrode wire of the corresponding light source unit.

5. The system according to claim 4, wherein the heat pipes of the plurality of cooling apparatuses are arranged such that shadows of the heat pipes are radially distributed at a constant interval around an optical axis on an effective light source distribution formed by the illumination optical system.

6. The system according to claim 5, further comprising:
    a measurement device configured to measure the effective light source distribution; and
    a control unit configured to adjust a position, an angle, or the position and the angle of the light source unit as a whole based on a measurement result of the measurement device.

7. The system according to claim 5, further comprising:
    a measurement device configured to measure the effective light source distribution; and
    a control unit configured to adjust a position, an angle, or the position and the angle of the heat pipe in the light source unit based on a measurement result of the measurement device.

8. An exposure apparatus comprising:
    an illumination optical system configured to illuminate an original on which a pattern is formed; and
    a projection optical system configured to project the pattern formed on the original onto a substrate,
    wherein the illumination optical system comprises:
    a plurality of light source units; and
    a plurality of cooling apparatuses corresponding to the plurality of light source units, respectively,
    each of the plurality of cooling apparatuses comprises:
    a cooling unit having a heat sink provided outside a path of light from a corresponding light source unit out of the plurality of light source units; and
    a heat pipe including a thermal conduction pipe having a first distal end, a second distal end, and a fluid sealed inside the thermal conduction pipe between the first distal end and the second distal end,
    wherein the heat pipe connects a heat generating portion of the corresponding light source unit disposed at the first distal end of the thermal conduction pipe and the heat sink disposed at the second distal end of the thermal conduction pipe, and moves heat generated at the heat generating portion of the corresponding light source unit to the heat sink by the fluid sealed inside the thermal conduction pipe between the first distal end and the second distal end, and
    the thermal conduction pipe also serves as an electrode wire of the corresponding light source unit.

9. A method of manufacturing an article comprising:
    exposing a substrate using an exposure apparatus; and
    developing the exposed substrate,
    wherein the exposure apparatus comprises:
    an illumination optical system configured to illuminate an original on which a pattern is formed; and
    a projection optical system configured to project the pattern formed on the original onto the substrate,
    the illumination optical system comprises:
    a plurality of light source units; and
    a plurality of cooling apparatuses corresponding to the plurality of light source units, respectively,
    each of the plurality of cooling apparatuses comprises:
    a cooling unit having a heat sink provided outside a path of light from a corresponding light source unit out of the plurality of light source units; and
    a heat pipe including a thermal conduction pipe having a first distal end, a second distal end, and a fluid sealed inside the thermal conduction pipe between the first distal end and the second distal end,
    wherein the heat pipe connects a heat generating portion of the corresponding light source unit disposed at the first distal end of the thermal conduction pipe and the heat sink disposed at the second distal end of the thermal conduction pipe, and moves heat generated at the heat generating portion of the corresponding light source unit to the heat sink by the fluid sealed inside the thermal conduction pipe between the first distal end and the second distal end, and the thermal conduction pipe also serves as an electrode wire of the corresponding light source unit.

\* \* \* \* \*